US011057002B2

(12) United States Patent
Wang et al.

(10) Patent No.: US 11,057,002 B2
(45) Date of Patent: Jul. 6, 2021

(54) AMPLIFIER CONFIGURABLE INTO MULTIPLE MODES

(71) Applicant: Analog Devices International Unlimited Company, Limerick (IE)

(72) Inventors: Li Wang, Beijing (CN); Hanqing Wang, Beijing (CN); Tony Yincai Liu, Beijing (CN); Shurong Gu, Beijing (CN)

(73) Assignee: Analog Devices International Unlimited Company, Limerick (IE)

( * ) Notice: Subject to any disclaimer, the term of this patent is extended or adjusted under 35 U.S.C. 154(b) by 121 days.

(21) Appl. No.: 16/444,871

(22) Filed: Jun. 18, 2019

(65) Prior Publication Data

US 2020/0403578 A1 Dec. 24, 2020

(51) Int. Cl.
| | | |
|---|---|---|
| *H03F 1/02* | (2006.01) | |
| *H03F 1/08* | (2006.01) | |
| *H03F 3/45* | (2006.01) | |
| *H03F 1/34* | (2006.01) | |
| *H03G 3/30* | (2006.01) | |
| *H03F 1/26* | (2006.01) | |

(52) U.S. Cl.
CPC ............... *H03F 1/08* (2013.01); *H03F 1/26* (2013.01); *H03F 1/34* (2013.01); *H03F 3/45071* (2013.01); *H03G 3/30* (2013.01); *H03F 2200/111* (2013.01); *H03F 2200/129* (2013.01); *H03F 2200/156* (2013.01); *H03F 2200/414* (2013.01); *H03F 2203/45116* (2013.01); *H03F 2203/45524* (2013.01); *H03F 2203/45534* (2013.01); *H03G 2201/103* (2013.01)

(58) Field of Classification Search
CPC ... H03F 1/02; H03F 1/08; H03F 3/005; H03F 2200/111
USPC ............................... 330/9, 86, 147; 327/124
See application file for complete search history.

(56) References Cited

U.S. PATENT DOCUMENTS

| | | |
|---|---|---|
| 6,094,045 A | 7/2000 | Zoellick |
| 6,806,771 B1 | 10/2004 | Hildebrant et al. |

(Continued)

FOREIGN PATENT DOCUMENTS

| | | |
|---|---|---|
| CN | 103346745 A | 10/2013 |
| CN | 107370465 A | 11/2017 |
| JP | 4837673 B2 | 10/2011 |

OTHER PUBLICATIONS

Yin, Tao, et al., "A Multi-Mode Interface for MEMS Vibratory Gyroscope with Self-Tuned Filter", Sensors, IEEE, (2014), 4 pgs.

(Continued)

*Primary Examiner* — Steven J Mottola
(74) *Attorney, Agent, or Firm* — Schwegman Lundberg & Woessner, P.A.

(57) ABSTRACT

This disclosure describes techniques for selecting one of a plurality of modes in which to operate an amplifier. The techniques include configuring input routing circuitry, coupled to first and second inputs of the amplifier, based on the selected one of the plurality of modes; selectively applying a resistance to an output of the amplifier, using feedback routing circuitry, based on the selected one of the plurality of modes; and selectively applying one of a plurality of reference voltages, using reference voltage routing circuitry, coupled to the first and the second inputs of the amplifier, based on the selected one of the plurality of modes.

20 Claims, 11 Drawing Sheets

(56) References Cited

U.S. PATENT DOCUMENTS

| | | |
|---|---|---|
| 8,975,916 B1 | 3/2015 | Yarlagadda et al. |
| 9,503,038 B2 | 11/2016 | Wu et al. |
| 2009/0002075 A1 | 1/2009 | Chilakapati et al. |
| 2009/0009239 A1* | 1/2009 | Trifonov ............. H03F 3/45475 330/9 |
| 2012/0161994 A1 | 6/2012 | Quiquempoix et al. |
| 2013/0154740 A1 | 6/2013 | Xie |

OTHER PUBLICATIONS

"Chinese Application Serial No. 202021137964.8, Notiification to Make Rectification dated Feb. 5, 2021", w/o English translation, 1 pg.

"Chinese Application Serial No. 202021137964.8, Notification to Make Rectification dated Nov. 10, 2020", w/o English Translation, 1 pg.

* cited by examiner

AMPLIFIER CONFIGURABLE INTO MULTIPLE MODES

FIELD OF THE DISCLOSURE

This document pertains generally, but not by way of limitation, to a multi-mode amplifier.

BACKGROUND

Amplifiers are typically used in many applications. For example, amplifiers can be used to apply a programmable AC or DC gain to an input voltage or as current to voltage converters. The application in which the amplifier is applied depends on how the inputs of the amplifier are configured relative to the amplifier outputs.

SUMMARY OF THE DISCLOSURE

In some certain embodiments, a system and method are provided for switching amplifier modes. In some embodiments, the system and method include a first amplifier configured to operate in one of a plurality of modes; input routing circuitry, coupled to first and second inputs of the first amplifier, configured to route an input signal to the first input of the first amplifier to configure the first amplifier to operate in a first mode of the plurality of modes and route the input signal to the second input of the first amplifier to configure the first amplifier to operate in a second mode of the plurality of modes; feedback routing circuitry, coupled to an output of the first amplifier, configured to route the output of the first amplifier through a first resistor to configure the first amplifier to operate in the first mode and route the output of the first amplifier through a second resistor to configure the first amplifier to operate in the second mode; and reference voltage routing circuitry, coupled to the first and the second inputs of the first amplifier, configured to route one of a plurality of reference voltages to the first or second inputs of the first amplifier based on an operation mode of the first amplifier.

In some embodiments, the system and method include control circuitry configured to provide a control signal to the input routing circuitry and the feedback routing circuitry, wherein the input routing circuitry comprises: a first switch coupled between the input signal and the first input of the first amplifier; and a second switch coupled between the input signal and the second input of the amplifier, and wherein the control signal configures the first amplifier to operate in the first mode by closing the first switch and opening the second switch and configures the first amplifier to operate in the second mode by opening the first switch and closing the second switch.

In some embodiments, the feedback routing circuitry comprises: a third switch coupled between the output of the first amplifier and the first resistor; and a fourth switch coupled between the output of the first amplifier and the second resistor, and wherein the control signal configures the first amplifier to operate in the first mode by closing the third switch and opening the fourth switch and configures the first amplifier to operate in the second mode by opening the third switch and closing the fourth switch.

In some embodiments, when the third switch is closed, the output of the first amplifier is coupled via the first resistor to the second input of the first amplifier; and when the fourth switch is closed, the output of the first amplifier is coupled via the second resistor to the second input of the first amplifier.

In some embodiments, reference voltage routing circuitry is further configured to: route a first reference voltage to the second input of the first amplifier to configure the first amplifier to operate in the first mode; route a second reference voltage to the first input of the first amplifier to configure the first amplifier to operate in the second mode; and route a third reference voltage to the first input of the first amplifier to configure the first amplifier to operate in a third mode of the plurality of modes, wherein the input routing circuitry is configured to route the input signal to the first input of the first amplifier to configure the first amplifier to operate in the third mode, and wherein the feedback routing circuitry is configured to route the output of the first amplifier through the first resistor to the second input of the first amplifier to configure the first amplifier to operate in the third mode.

In some embodiments, the first mode comprises a programmable gain amplifier direct current mode, the second mode comprises a current to voltage converter mode, and the third mode comprises a programmable gain amplifier alternating current mode. In some embodiments, first reference voltage comprises a voltage shift applied to a second input signal that is routed to the second input of the first amplifier when the first amplifier is configured to operate in the first mode, wherein the voltage shift is generated using a first buffer amplifier.

In some embodiments, the systems and methods include leakage prevention routing circuitry, coupled between a terminal of the second resistor and the input signal, configured to: route the terminal of the second resistor to ground and prevent the terminal of the second resistor from being coupled to the input signal when the first amplifier is configured to operate in the first mode; and couple the terminal of the second resistor to the input signal when the first amplifier is configured to operate in the second mode.

In some embodiments, the method includes selecting one of a plurality of modes in which to operate a first amplifier; configuring input routing circuitry, coupled to first and second inputs of the first amplifier, based on the selected one of the plurality of modes, such that: an input signal is routed by the input routing circuitry to the first input of the first amplifier to configure the first amplifier to operate in a first mode of the plurality of modes; and the input signal is routed to the second input of the first amplifier to configure the first amplifier to operate in a second mode of the plurality of modes; selectively applying a resistance to an output of the first amplifier, using feedback routing circuitry, based on the selected one of the plurality of modes, such that: an output of the first amplifier is routed by the feedback routing circuitry through a first resistor to configure the first amplifier to operate in the first mode; and the output of the first amplifier is routed by the feedback routing circuitry through a second resistor to configure the first amplifier to operate in the second mode; and selectively applying one of a plurality of reference voltages, using reference voltage routing circuitry, coupled to the first and the second inputs of the first amplifier, based on the selected one of the plurality of modes.

In some embodiments, the method includes providing a control signal to the input routing circuitry and the feedback routing circuitry, wherein the input routing circuitry comprises: a first switch coupled between the input signal and the first input of the first amplifier; and a second switch coupled between the input signal and the second input of the amplifier, and wherein the control signal configures the first amplifier to operate in the first mode by closing the first switch and opening the second switch and configures the first amplifier to operate in the second mode by opening the first switch and closing the second switch. In some implementations, the feedback routing circuitry comprises: a third switch coupled between the output of the first amplifier and the first resistor; and a fourth switch coupled between the output of the first amplifier and the second resistor, and wherein the control signal configures the first amplifier to operate in the first mode by closing the third switch and opening the fourth switch and configures the first amplifier to operate in the second mode by opening the third switch and closing the fourth switch.

In some embodiments, when the third switch is closed, the output of the first amplifier is coupled via the first resistor to the second input of the first amplifier; and when the fourth switch is closed, the output of the first amplifier is coupled via the second resistor to the second input of the first amplifier.

In some embodiments, the reference voltage routing circuitry is configured to: route a first reference voltage to the second input of the first amplifier to configure the first amplifier to operate in the first mode; route a second reference voltage to the first input of the first amplifier to configure the first amplifier to operate in the second mode; and route a third reference voltage to the first input of the first amplifier to configure the first amplifier to operate in a third mode of the plurality of modes, wherein the input routing circuitry is configured to route the input signal to the first input of the first amplifier to configure the first amplifier to operate in the third mode, and wherein the feedback routing circuitry is configured to route the output of the first amplifier through the first resistor to the second input of the first amplifier to configure the first amplifier to operate in the third mode.

In some implementations, the first reference voltage comprises a voltage shift applied to a second input signal that is routed to the second input of the first amplifier when the first amplifier is configured to operate in the first mode, and wherein the voltage shift is generated using a first buffer amplifier. In some implementations, the first mode comprises a programmable gain amplifier direct current mode, the second mode comprises a current to voltage converter mode, and a third mode comprises a programmable gain amplifier alternating current mode.

In some embodiments, systems and methods are provided for switching amplifier modes. The systems and methods include an amplifier configured to operate in one of a plurality of modes; input routing circuitry, coupled to a first input of the amplifier, configured to route a first input signal, received via a first physical connection, to the first input of the amplifier to configure the amplifier to operate in a first mode of the plurality of modes and route a second input signal, received via a second physical connection, to the first input of the amplifier to configure the amplifier to operate in a second mode of the plurality of modes; and feedback routing circuitry, coupled to an output of the amplifier, configured to route the output of the amplifier through a first resistor to the first input signal to configure the first amplifier to operate in the first mode and route the output of the amplifier through a second resistor to the second input signal to configure the amplifier to operate in the second mode.

In some embodiments, the first and second physical connections comprise respective first and second negative input pins, further comprising control circuitry configured to provide a control signal to the input routing circuitry and the feedback routing circuitry, wherein the input routing circuitry comprises: a first switch coupled between the first input signal and the first input of the first amplifier; and a second switch coupled between the second input signal and the first input of the amplifier, and wherein the control signal configures the first amplifier to operate in the first mode by closing the first switch and opening the second switch and configures the first amplifier to operate in the second mode by opening the first switch and closing the second switch. In some implementations, a second input of the amplifier is coupled to a reference voltage.

In some embodiments, the feedback routing circuitry comprises: a third switch coupled between the output of the first amplifier and the first resistor; and a fourth switch coupled between the output of the first amplifier and the second resistor, and wherein the control signal configures the first amplifier to operate in the first mode by closing the third switch and opening the fourth switch and configures the first amplifier to operate in the second mode by opening the third switch and closing the fourth switch.

In some implementations, the first mode comprises a programmable gain amplifier direct current mode, the second mode comprises a current to voltage converter mode, and a third mode comprises a programmable gain amplifier alternating current mode.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
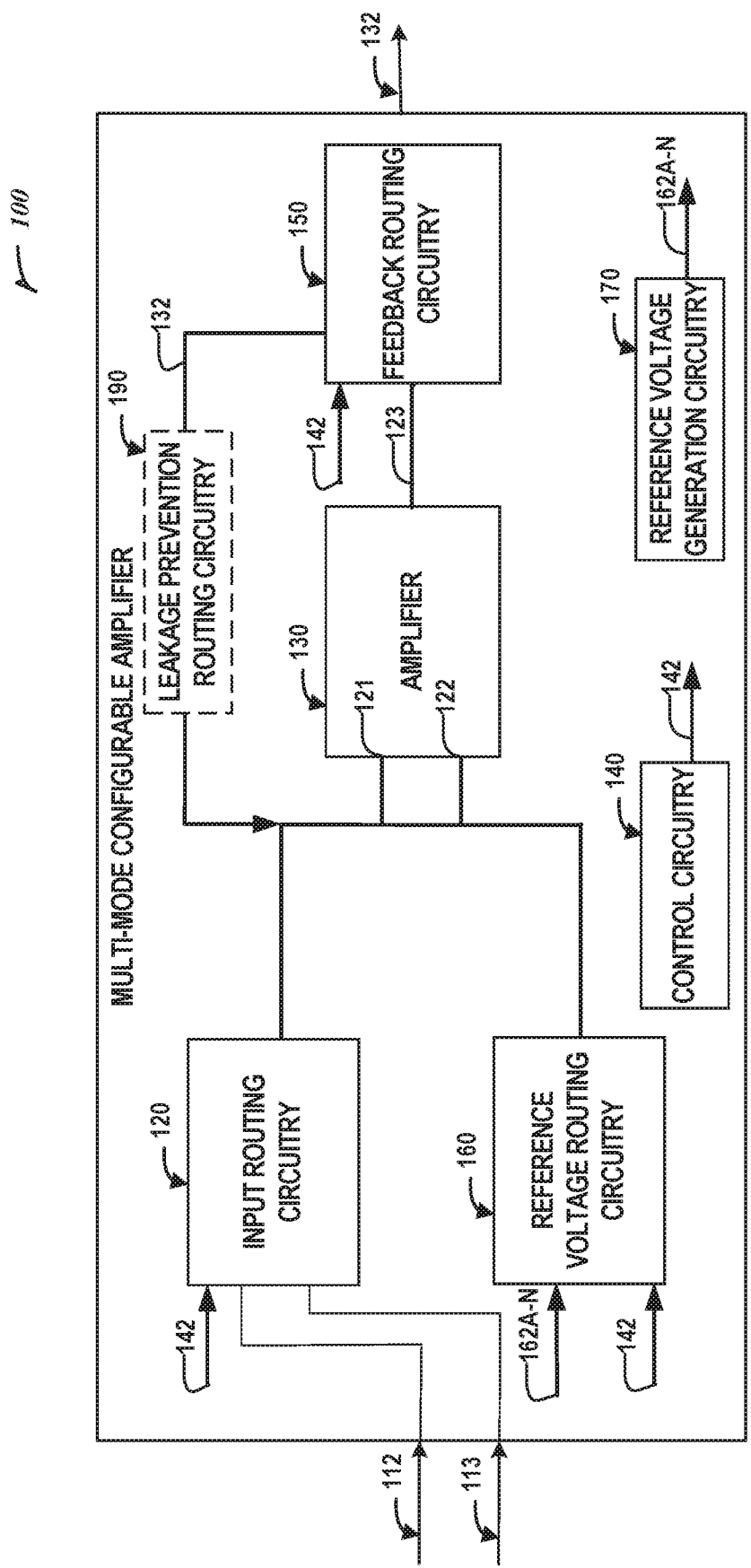
FIG. 1 is a block diagram of an example of a multi-mode configurable amplifier in accordance with various embodiments.

This disclosure describes, among other things, techniques for selectively operating an amplifier in one of multiple modes. Specifically, the disclosed techniques utilize input routing circuitry, reference voltage routing circuitry, feedback routing circuitry, and/or leakage prevention routing circuitry to selectively route one or more input signals and/or one or more reference voltage signals to inputs of an amplifier and to selectively route an output of the amplifier via one or more resistors to one or more inputs of the amplifier. The configuration for how the signals are routed to the inputs of the amplifier and from the amplifier outputs is determined by one of a plurality of amplifier modes that is selected by control circuitry and by one or more switches included in the input routing circuitry, reference voltage routing circuitry, feedback routing circuitry, and/or leakage prevention routing circuitry. According to the disclosed embodiments, the physical space on a device and the power consumed by the device are reduced by allowing the same amplifier to be selectively used in one of several different applications or modes.

Amplifiers are typically used in many applications. For example, amplifiers can be used to apply a programmable AC or DC gain to an input (e.g., as a programmable gain amplifier (PGA)) or as current to voltage converters in which a current input signal is converted to a voltage signal (e.g., as a transimpedance amplifier (TIA)). The application in which the amplifier is applied depends on how the inputs of the amplifier are configured relative to the amplifier outputs. Typically, amplifiers are implemented on a given device and are configured to operate in one particular mode by routing signals to the inputs of the amplifier and from the output of the amplifier via dedicated paths. In order for typical devices to provide multiple applications of the amplifiers, separate amplifiers configured to operate in separate modes are implemented. For example, a device may include one amplifier in which the inputs and output are routed in one configuration to provide gain to the input signal and another amplifier is implemented in which the inputs and outputs are routed in a different configuration to convert a current input signal to a voltage output signal. While such devices work well, the amount of physical space and power consumed by using multiple amplifiers for different modes introduces inefficiencies. Also, the amplifiers in these devices consume physical space that can otherwise be allocated to other resources and functions. Finally, such devices are expensive to manufacture given the additional complexity of implementing multiple amplifiers.

Some other prior approaches have considered using a single amplifier for multiple applications. However, these prior approaches fail to consider the need to route feedback signals through different resistors via separate switching paths or the need to disconnect and/or ground certain resistors that are not used to provide different feedback configurations. As such, the outputs of such a single amplifier used for different modes in these prior approaches does not provide the same performance as using separate amplifiers for each different mode. For example, such approaches fail to address leakage in the current flow of the feedback path of the amplifier output in the different modes which introduces non-linearity errors when measuring external current and affects the overall stability of the amplifier.

To address the shortcomings of such approaches, the disclosed techniques selectively operate an amplifier in one of multiple modes using various switching and routing circuitry. The amplifier according to the disclosed techniques provides outputs in different modes and has the same or similar performance as if separate amplifiers were used to implement the different modes to provide such outputs. Particularly, the disclosed embodiments utilize input routing circuitry, reference voltage routing circuitry, feedback routing circuitry, and/or leakage prevention routing circuitry to selectively route one or more input signals and/or one or more reference voltage signals to inputs of an amplifier and to selectively route an output of the amplifier via one or more resistors to one or more inputs of the amplifier based on the mode in which the amplifier is selected to operate. In this way, the physical space on a device and the power consumed by the device are reduced by allowing the same amplifier to be selectively used in one of several different applications or modes without sacrificing performance of the amplifier.

FIG. 1 is a block diagram of an example of a multi-mode configurable amplifier 100 in accordance with various embodiments. The multi-mode configurable amplifier 100 includes input routing circuitry 120, reference voltage routing circuitry 160, control circuitry 140, an amplifier 130, feedback routing circuitry 150, reference voltage generation circuitry 170 and may also include leakage prevention routing circuitry 190. According to some embodiments, the control circuitry 140 communicates one or more control signals 142 to the input routing circuitry 120, reference voltage routing circuitry 160, feedback routing circuitry 150, and leakage prevention routing circuitry 190.

In some embodiments, the input routing circuitry 120 may include one or more input resistors that can be selectively coupled to the input signals 112 and 113. The feedback routing circuitry 150 may include one or more resistors that can be selectively coupled between the output 123 of the amplifier 130 and one of the inputs 121 or 122 of the amplifier 130. Leakage prevention routing circuitry 190 may include one or more switches that can selectively ground one or more of the resistors of the feedback routing circuitry 150, such as when such resistors are not used in a particular mode of operation of the amplifier 130. Reference voltage generation circuitry 170 may include one or more buffer amplifiers for generating a plurality of different reference voltages 162A-N.

The control signals 142 open and close specific switches in the input routing circuitry 120, reference voltage routing circuitry 160, feedback routing circuitry 150, and leakage prevention routing circuitry 190 to control the mode in which amplifier 130 operates.

For example, the control circuitry 140 can configure the multi-mode configurable amplifier 100 to operate in a DC PGA mode in which a gain is applied to a DC input signal received at inputs 112 and 113 at the output 132. In such circumstances, the control circuitry 140 generates control signals 142 that control switches in the input routing circuitry 120 to couple a positive input signal received at input 112 to a positive input 121 of amplifier 130. The control signals 142 further control switches in the input routing circuitry 120 to couple a negative input signal received at input 113 to a negative input 122 of amplifier 130 via a resistor R1 which may be included in the input routing circuitry 120. The control signals 142 further control switches in the reference voltage routing circuitry 160 to couple a first reference voltage 162A, which is generated by the reference voltage generation circuitry 170, to the negative input 122 of amplifier 130 via the resistor R1.

The control signals 142 further control switches in the feedback routing circuitry 150 to couple the output 123 of the amplifier 130 via a first resistor R2 to the negative input 122 of the amplifier 130. The output 123 of the amplifier 130 is also connected via a switch in the feedback routing circuitry 150 to a second resistor RTIA. When the multi-mode configurable amplifier 100 is configured to operate in the DC PGA mode, the control signals 142 open the switch in the feedback routing circuitry 150 to disconnect the output 123 of the amplifier 130 from the second resistor RTIA. An example embodiment in which the multi-mode configurable amplifier 100 is configured to operates in a DC PGA mode is shown and described in connection with FIG. 2B.

For example, the control circuitry 140 can configure the multi-mode configurable amplifier 100 to operate in a TIA mode in which a current received at an input signal from inputs 112 is converted to a voltage at the output 123. In such circumstances, the control circuitry 140 generates control signals 142 that control switches in the input routing circuitry 120 to couple a positive input signal received at input 112 to a negative input 122 of amplifier 130. The control signals 142 further control switches in the reference voltage routing circuitry 160 to couple a second reference voltage 162B, which is generated by the reference voltage generation circuitry 170, to the positive input 121 of amplifier 130.

The control signals 142 further control switches in the feedback routing circuitry 150 to couple the output 123 of the amplifier 130 via the second resistor RTIA to the negative input 122 of the amplifier 130. An example embodiment in which the multi-mode configurable amplifier 100 is configured to operates in a TIA mode is shown and described in connection with FIG. 2C.

In certain embodiments, to prevent leakage current at the output of the amplifier 130 and to improve stability, the control signals 142 connect one or more resistors in the feedback routing circuitry 150 to ground when such resistors are not used in a particular mode. For example, when the control circuitry 140 configures the amplifier to operate in the DC PGA mode, the control signals 142 control the feedback routing circuitry 150 to disconnect the output 123 of amplifier 130 from a first terminal of the second resistor RTIA. Also, the control signals 142 control the leakage prevention routing circuitry 190 to connect a second terminal of the second resistor RTIA to ground. Particularly, the second resistor RTIA may be implemented by a very large size switching array to support large current inputs. Because of this, if the second terminal of the second resistor RTIA remains coupled to the input signal 112, the second resistor RTIA can contribute large leakage current flow into the external resistor (Rext) in the PGA mode. This may result in non-linearity errors when measuring external current. Also, the second resistor RTIA being in series with the parasitic capacitance Cpar connected between the input and output of the amplifier 130 affects the stability of the PGA mode.

To address these issues, the control signals 142 control the leakage prevention routing circuitry 190 to connect a second terminal of the second resistor RTIA to ground when the amplifier 130 operates in PGA mode to prevent the second resistor RTIA from supplying leakage current to the input signal even when such a resistor is decoupled from the output 123 of the amplifier 130. Namely, disconnecting the second resistor RTIA from the output 123 of the amplifier 130 may not be enough to avoid leakage current flow to the input and accordingly the leakage prevention routing circuitry 190 is utilized to also ground and disconnect the terminal of the second resistor RTIA that is otherwise connected to the input signal. An example embodiment in which the multi-mode configurable amplifier 100 is configured to operates in a DC PGA mode with leakage prevention is shown and described in connection with FIG. 3B. An example embodiment in which the multi-mode configurable amplifier 100 is configured to operates in an AC PGA mode with leakage prevention is shown and described in connection with FIG. 3C.

Figure 2A:
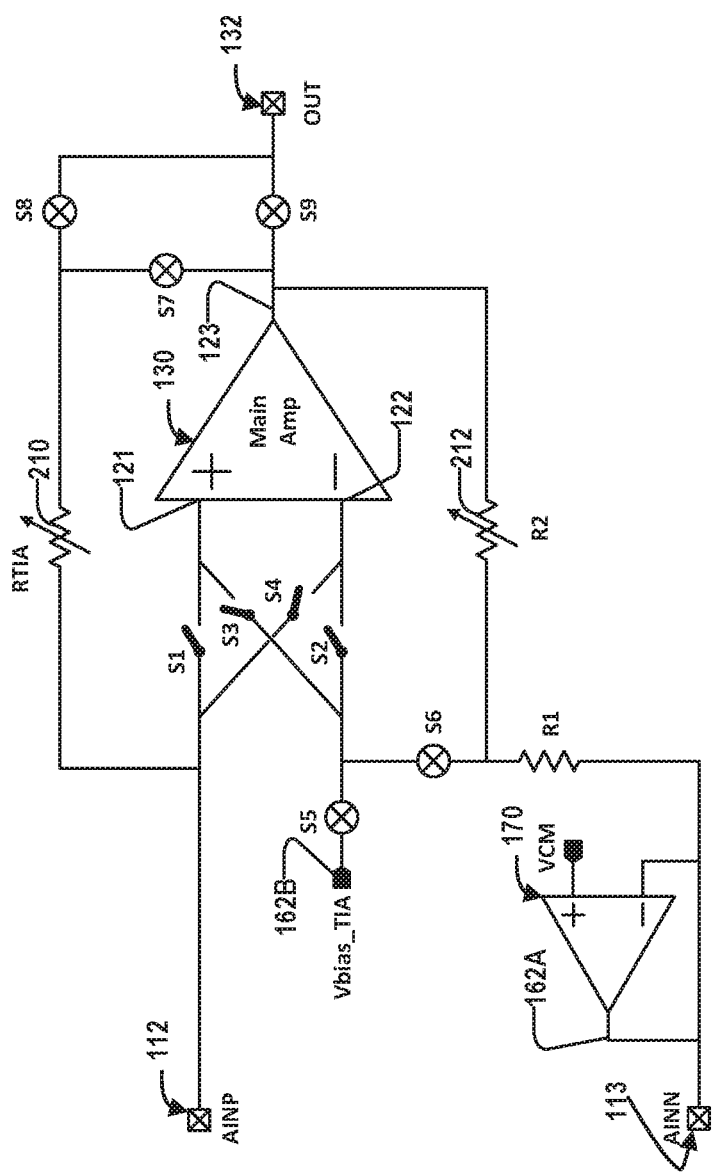
FIGS. 2A-C is a block diagram of an example of a multi-mode configurable amplifier in accordance with various embodiments.

FIG. 2A is a block diagram of an example of a multi-mode configurable amplifier 200A in accordance with various embodiments. Specifically, the amplifier 200A shown in FIG. 2A illustrates one implementation of the multi-mode configurable amplifier 100 (FIG. 1). Multi-mode configurable amplifier 200A includes an RTIA resistor 210 (which may be implemented by a resistor switching network and may be variable), an R2 resistor 212 (which may be implemented by a resistor switching network and may be variable), multiple switches S1-S9, an amplifier of the reference voltage generation circuitry 170 to output a first reference voltage 162A, and a second reference voltage 162B provided by the reference voltage generation circuitry 170. The multi-mode configurable amplifier 200A supports a PGA mode and a TIA mode in which one main buffer amplifier 130 is shared to save area and reduce power consumption. Both external voltage input or current input can be measured using multi-mode configurable amplifier 200A.

Figure 2B:
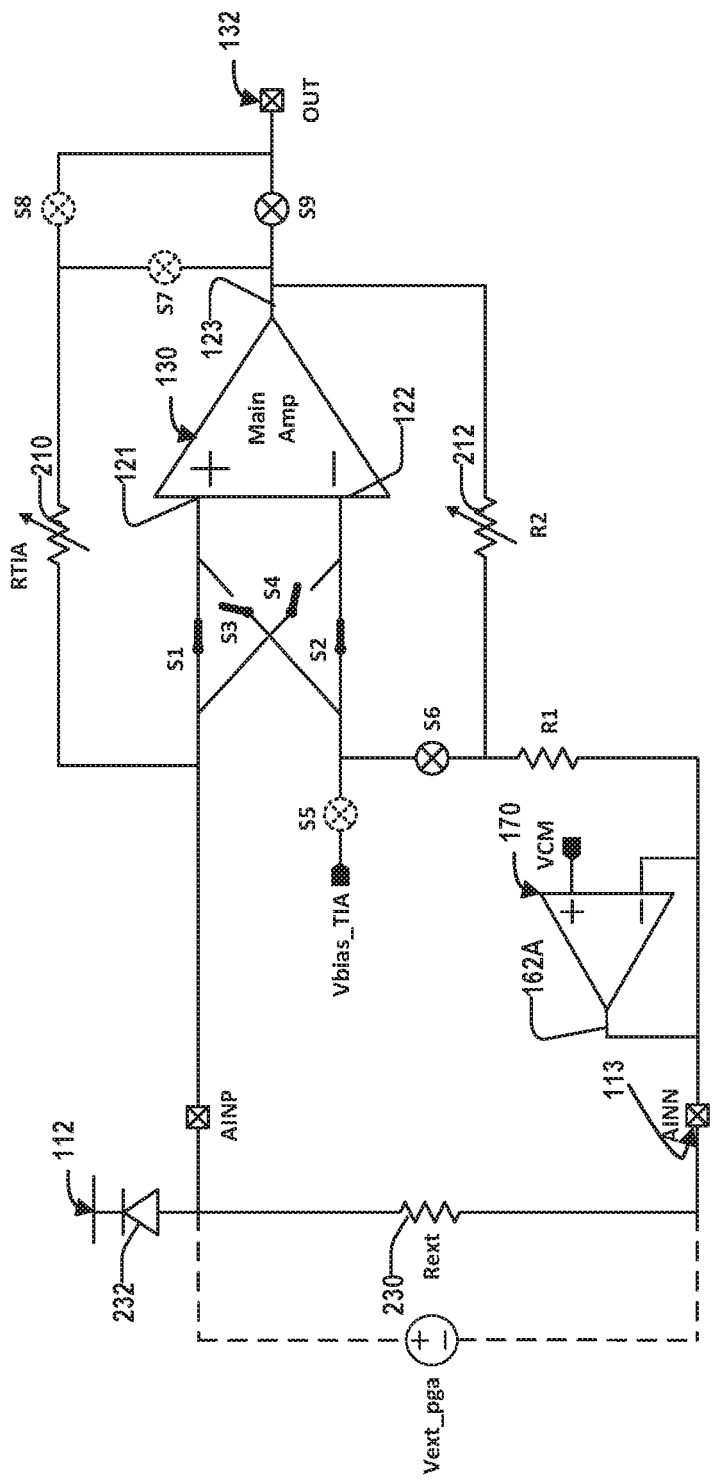
Figure 2C:
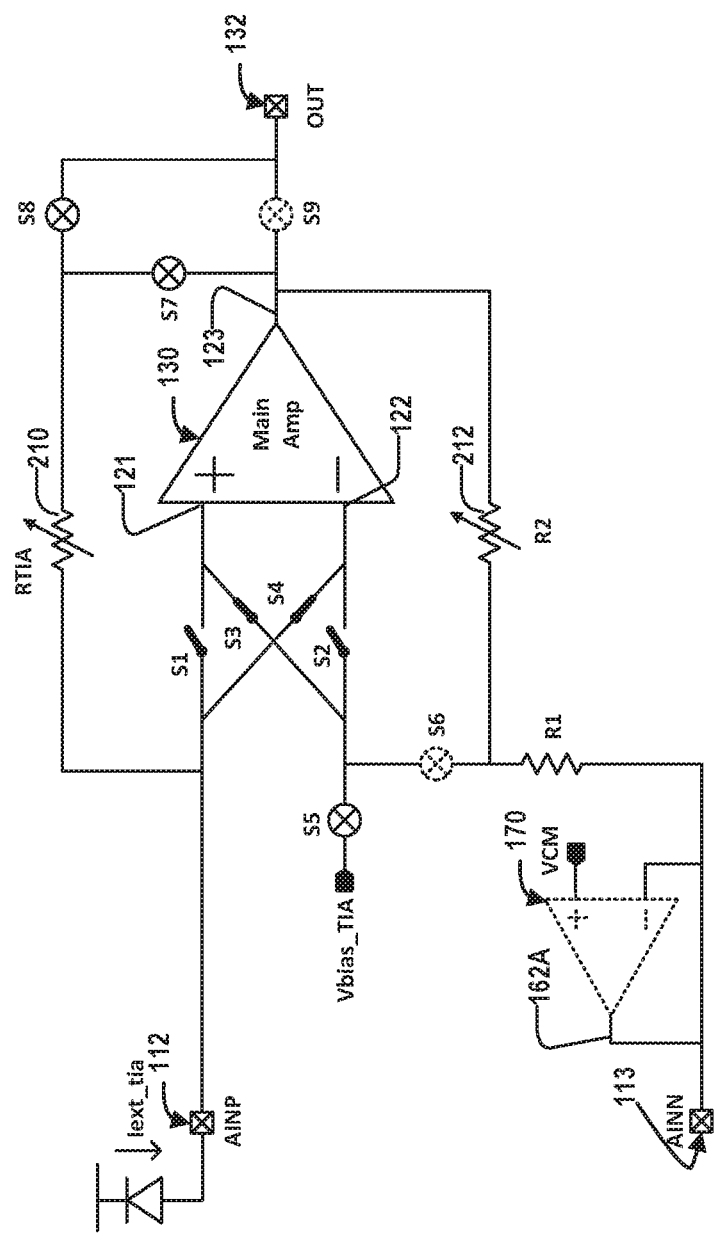

In one example of the embodiment shown in FIGS. 2A-C, switches S1-S4 form part of the input routing circuitry 120, switches S5 and S6 and resistor R1 form part of the reference voltage routing circuitry 160, and switches S7-S9, the RTIA resistor 210, and the R2 resistor 212 form part of the feedback routing circuitry 150. In some embodiments, certain elements or the entire portions of one of the routing circuitries shown in FIG. 1 can be shared or form portions of another of the routing circuities shown in FIG. 1.

Four cross switches (S1-S4) are used to select an input from the PGA or TIA mode. In the case of the PGA mode, the input is provided to the positive terminal of the amplifier 130 using the cross switches (S1-S4). In the case of the TIA mode, the input is provided to the negative terminal of the amplifier 130 using the cross switches (S1-S4). The TIA mode can directly measure external current from an input signal 112. The PGA mode may need an external resistor to be added to generate a voltage drop as the PGA input. The PGA mode supports DC inputs and AC inputs, where in the AC input PGA mode, the multi-mode configurable amplifier 200A can be configured as a bandpass filter.

FIG. 2B is a block diagram of an example of a multi-mode configurable amplifier 200B in accordance with various embodiments. Specifically, multi-mode configurable amplifier 200B shows one embodiment of multi-mode configurable amplifier 200A in which the multi-mode configurable amplifier 200A is configured by the control circuitry 140 to operate in a DC PGA mode. To implement the multi-mode configurable amplifier 200A to operate in the DC PGA mode, multi-mode configurable amplifier 200B shows which switches of the input routing circuitry 120 and the feedback routing circuitry 150 are controlled to be open or closed by the control signals 142. Elements shown in dashed or dotted lines represent open switches or devices that are disconnected in a particular mode. Such elements and devices are still implemented on the multi-mode configurable amplifier 200B but are in a disconnected state.

For example, to configure the multi-mode configurable amplifier 200B to operate in the DC PGA mode, an external resistor 230 may be coupled between the input signals 112 and 113 and the input signal 112 is connected to a diode 232. The switches S1 and S2 may be controlled to be in the closed state by the control signals 142 and the switches S3 and S4 may be controlled to be in the open state by the control signals 142. Also, switch S9 is controlled to be in the closed state while switches S7 and S8 are controlled to be in the open state. Switch S6 is controlled to be in the closed state while switch S5 is controlled to be in the open state. In this configuration, the input signal 112 is connected to the positive input 121 of the amplifier 130 via switch S1 and the input signal 113 is connected to the negative input 122 of the amplifier 130 via a resistor R1 and switch S6 and S2. The first reference voltage 162A is connected via a resistor R1 and the switches S6 and S2 to the negative input 122 of the amplifier 130. In addition, the output 123 of the amplifier is connected to the output of the multi-mode configurable amplifier 200B via switch S9 and is also fed back via the R2 resistor 212 to the negative input 122 via switches S6 and S2. Also by opening switch S5, the second reference voltage 162B (e.g., Vbias_TIA) is disconnected from the positive and negative inputs 121/122 of the amplifier 130. As such, the output of the multi-mode configurable amplifier 200B is represented as:

PGA_OUT=pga_gain*(Iext_pga*Rext)+Vout_shift.

In some cases, in the DC PGA mode, instead of providing a voltage drop between the inputs 112 and 113, an external voltage source can be coupled between the inputs 112 and 113. In such cases, the external resistor and diode can be omitted in which case the output of the multi-mode configurable amplifier 200B can be represented as: PGA_OUT=pga_gain*Vext_pga+Vout_shift.

FIG. 2C is a block diagram of an example of a multi-mode configurable amplifier 200C in accordance with various embodiments. Amplifiers 200A-C include the same components but are configured to provide different modes for the amplifier 130 by closing or opening different sets of the switches S1-S9. Specifically, multi-mode configurable amplifier 200C shows one embodiment of multi-mode configurable amplifier 200A in which the multi-mode configurable amplifier 200A is configured by the control circuitry 140 to operate in a TIA mode. To implement the multi-mode configurable amplifier 200A to operate in the TIA mode, multi-mode configurable amplifier 200C shows which switches of the input routing circuitry 120 and the feedback routing circuitry 150 are controlled to be open or closed by the control signals 142. Elements shown in dashed or dotted lines represent open switches or devices that are disconnected in a particular mode. Such elements and devices are still implemented on the multi-mode configurable amplifier 200C but are in a disconnected state.

For example, to configure the multi-mode configurable amplifier 200C to operate in the TIA mode, the switches S1 and S2 may be controlled to be in the open state by the control signals 142 and the switches S3 and S4 may be controlled to be in the closed state by the control signals 142. Also, switch S9 is controlled to be in the open state while switches S7 and S8 are controlled to be in the closed state. Switch S6 is controlled to be in the open state while switch S5 is controlled to be in the closed state. In this configuration, the input signal 112 is connected to the negative input 122 of the amplifier 130 via closed switch S4. In addition, the output 123 of the amplifier is connected to the output of the multi-mode configurable amplifier 200C (via switches S7 and S8) and is also fed back via the RTIA resistor 210 to the negative input 122 of the amplifier 130 (via closed switches S7 and S4). Also by closing switch S5, the second reference voltage 162B (e.g., Vbias_TIA) is connected to the positive input 121 of the amplifier 130. By opening switch S6, the first reference voltage 162A is disconnected from the positive and negative inputs 121/122 of the amplifier 130. In this mode, the output of the multi-mode configurable amplifier 200B is represented as:

TIA_OUT=VBIAS_TIA−Iext_tia*RTIA.

In some embodiments, to address leakage current and stability issues, additional switches are provided to coupled resistors that are not in use in a given mode to ground.

Figure 3A:
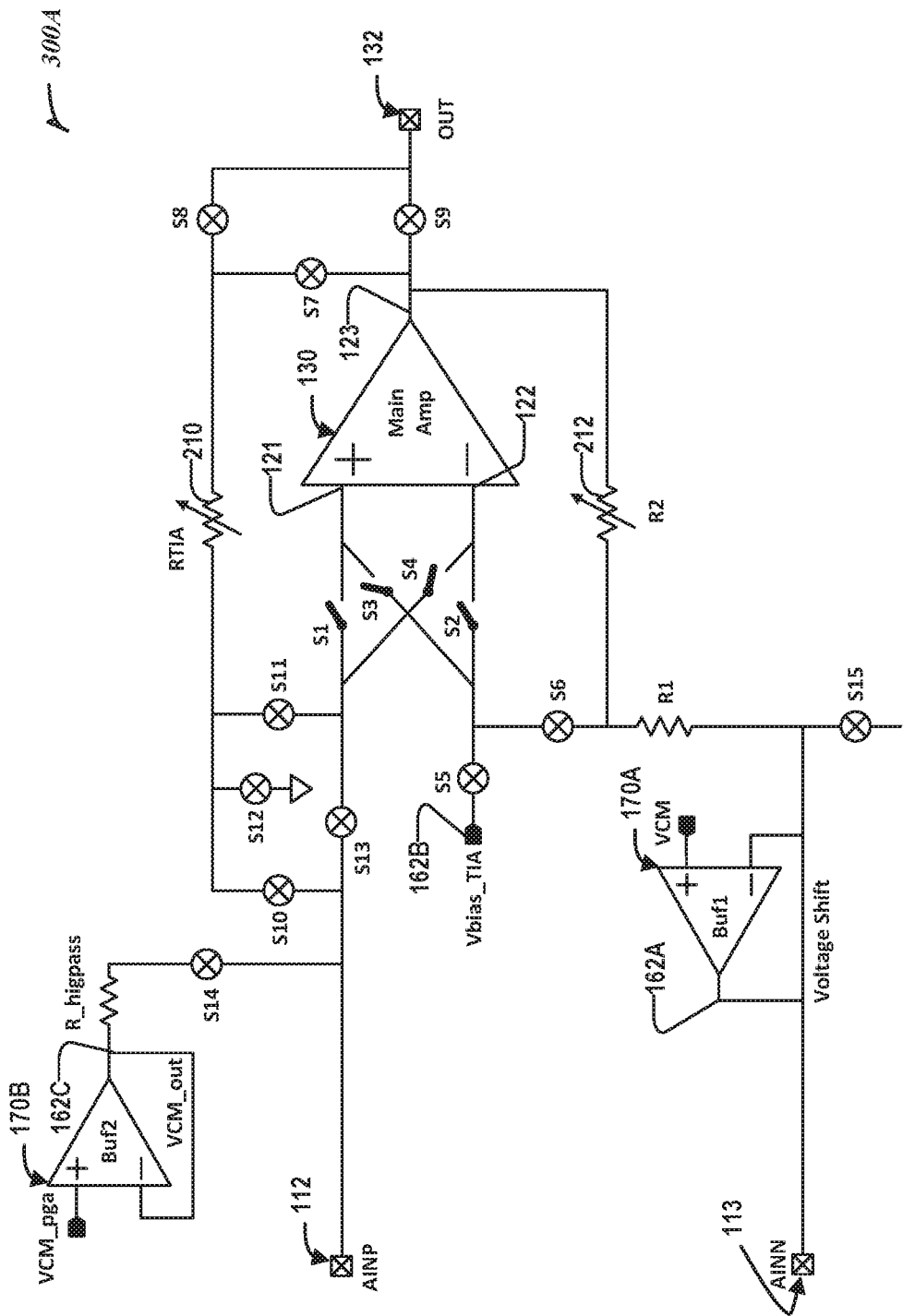
FIGS. 3A-D is a block diagram of an example of a multi-mode configurable amplifier in accordance with various embodiments.

FIG. 3A is a block diagram of an example of a multi-mode configurable amplifier 300A in accordance with various embodiments that addresses leakage current and stability issues. Specifically, the amplifier 300A shown in FIG. 3 illustrates one implementation of the multi-mode configurable amplifier 100 (FIG. 1). Multi-mode configurable amplifier 300A includes the same components as those shown in FIGS. 2A-B and additionally includes switches of the leakage prevention routing circuitry 190 (e.g., switches S10-S13) and a third reference voltage generator 170B providing a third reference voltage 162C. Specifically, the multi-mode configurable amplifier 300A includes the RTIA resistor 210 (which may be implemented by a resistor switching network and may be variable), the R2 resistor 212 (which may be implemented by a resistor switching network and may be variable), multiple switches S1-S15, first and second amplifiers 170A-B of the reference voltage generation circuitry 170 to output a first reference voltage 162A, a third reference voltage 162C, and a second reference voltage 162B provided by the reference voltage generation circuitry 170. The multi-mode configurable amplifier 300A supports a PGA mode in direct current (DC) and alternating current (AC) and a TIA mode in which one main buffer amplifier 130 is shared to save area and reduce power consumption. To support the PGA AC mode, the third reference voltage generator 170B that provides the third reference voltage 162C together with switches S14 and S15 are added relative to the multi-mode configurable amplifiers 200A-C (FIG. 2). Both external voltage input or current input can be measured using multi-mode configurable amplifier 300A.

In one example of the embodiment shown in FIGS. 3A-D, switches S1-S4, S13, S6 and S15 and resistor R1 form part of the input routing circuitry 120, switches S14 and S5 form part of the reference voltage routing circuitry 160, switches S7-S9, the RTIA resistor 210, and the R2 resistor 212 form part of the feedback routing circuitry 150, and the switches S10-S13 form part of the leakage prevention routing circuitry 190.

Figure 3B:
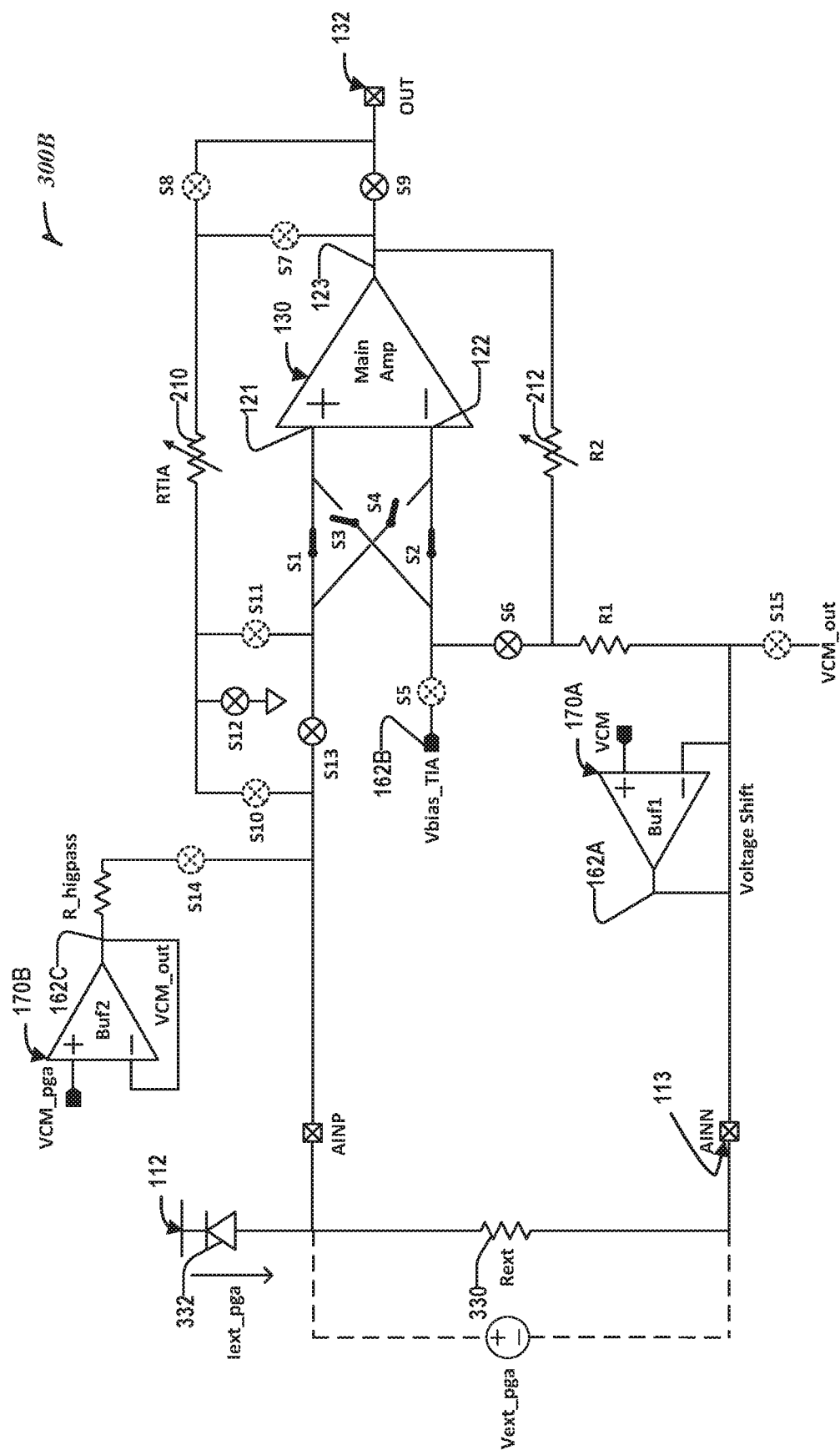

FIG. 3B is a block diagram of an example of a multi-mode configurable amplifier 300B in accordance with various embodiments. Specifically, multi-mode configurable amplifier 300B shows one embodiment of multi-mode configurable amplifier 300A in which the multi-mode configurable amplifier 300A is configured by the control circuitry 140 to operate in a DC PGA mode. To implement the multi-mode configurable amplifier 300A to operate in the DC PGA mode, multi-mode configurable amplifier 300B shows which switches of the input routing circuitry 120, leakage prevention routing circuitry 190, and the feedback routing circuitry 150 are controlled to be open or closed by the control signals 142. Elements shown in dashed or dotted lines represent open switches or devices that are disconnected in a particular mode. Such elements and devices are still implemented on the multi-mode configurable amplifier 300B but are in a disconnected state.

For example, to configure the multi-mode configurable amplifier 300B to operate in the DC PGA mode, an external resistor 330 may be coupled between the input signals 112 and 113 and the input signal 112 is connected to a diode 332. The switches S1, S2, S6, S9, S12 and S13 may be controlled to be in the closed state by the control signals 142 and the switches S3, S4, S5, S7, S8, S10, S11, S14 and S15 may be controlled to be in the open state by the control signals 142.

In this configuration, the input signal 112 is connected to the positive input 121 of the amplifier 130 via closed switches S1 and S13 and the input signal 113 is connected to the negative input 122 of the amplifier 130 via a resistor R1 and closed switch S6. The first reference voltage 162A is connected via a resistor R1 and the closed switches S6 and S2 to the negative input 122 of the amplifier 130. In addition, the output 123 of the amplifier 130 is connected to the output of the multi-mode configurable amplifier 300B via closed switch S9 and is also fed back via the R2 resistor 212 to the negative input 122 via closed switches S6 and S2. Also by opening switch S5, the second reference voltage 162B (e.g., Vbias_TIA) is disconnected from the positive and negative inputs 121/122 of the amplifier 130. The output 123 of the amplifier is disconnected from a first terminal of the RTIA resistor 210 by opening switches S7 and S8. Also, to prevent leakage of current from the RTIA resistor 210, the switches S10 and S11 are opened and switch S12 connected to a second terminal of the RTIA resistor 210 is closed. The second terminal of the RTIA resistor 210 is connected to ground by closing the switch S12. In addition, switch S14 is opened to prevent application of the third reference voltage 162C from being applied to the input signal 112.

Figure 3C:
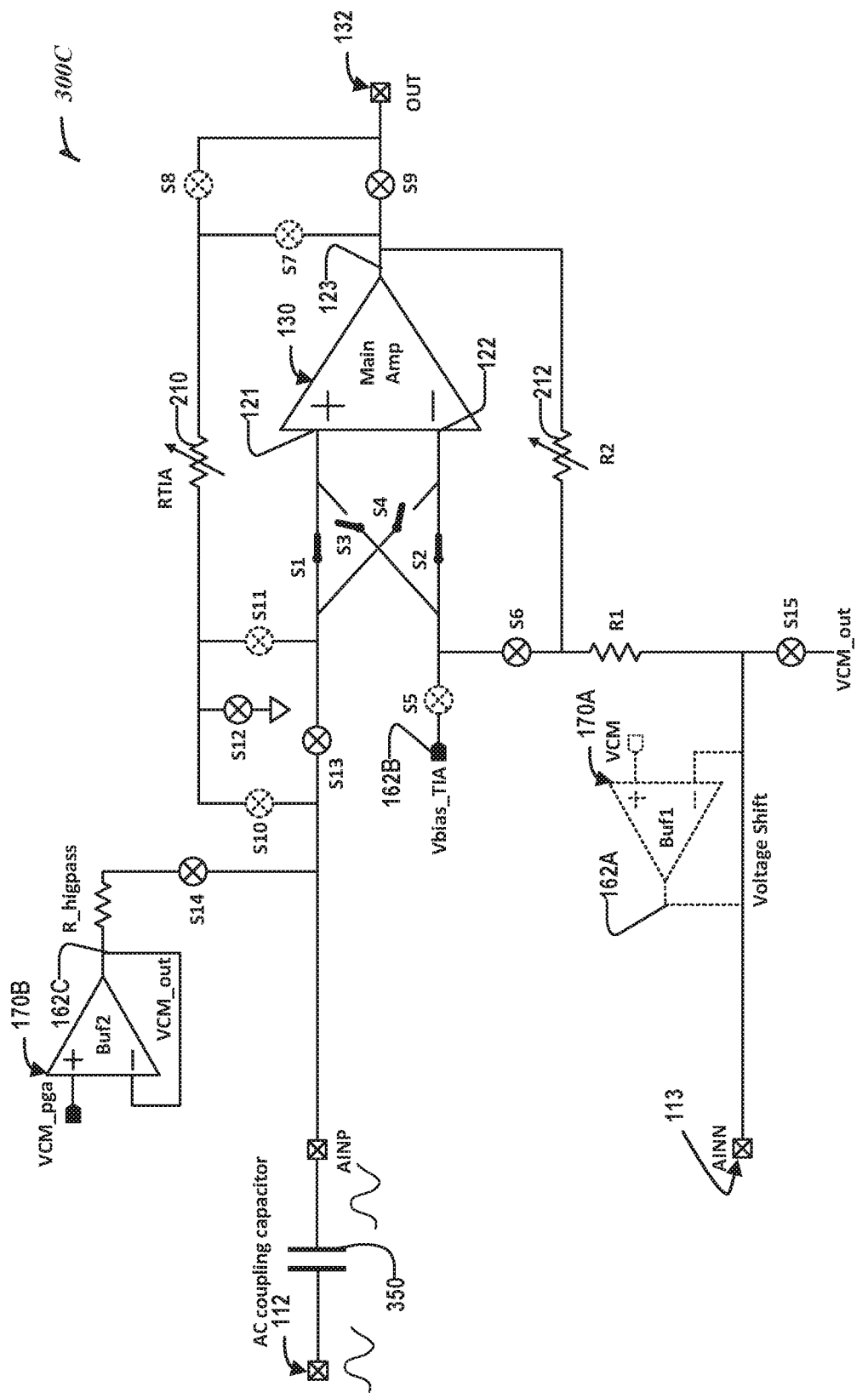

FIG. 3C is a block diagram of an example of a multi-mode configurable amplifier 300C in accordance with various embodiments. Specifically, multi-mode configurable amplifier 300C shows one embodiment of multi-mode configurable amplifier 300A in which the multi-mode configurable amplifier 300A is configured by the control circuitry 140 to operate in an AC PGA mode. To implement the multi-mode configurable amplifier 300A to operate in the AC PGA mode, multi-mode configurable amplifier 300C shows which switches of the input routing circuitry 120, leakage prevention routing circuitry 190, and the feedback routing circuitry 150 are controlled to be open or closed by the control signals 142. Elements shown in dashed or dotted lines represent open switches or devices that are disconnected in a particular mode. Such elements and devices are still implemented on the multi-mode configurable amplifier 300C but are in a disconnected state.

For example, to configure the multi-mode configurable amplifier 300C to operate in the AC PGA mode, an AC coupling capacitor 350 (which may be an off-chip component) may be coupled between the input signal 112 and the positive input 121 of amplifier 130. The switches S1, S2, S6, S9, S12, S13, S14 and S15 may be controlled to be in the closed state by the control signals 142 and the switches S3, S4, S5, S7, S8, S10, and S11 may be controlled to be in the open state by the control signals 142. Also, control signals 142 may turn OFF the first amplifier 170A (e.g., buffer amplifier) of the reference voltage generation circuitry 170 to avoid generating the first reference voltage 162A. In some embodiments, rather than turning OFF first amplifier 170A, an additional switch may be added and opened between an output of the first amplifier 170A and the input signal 113. The second amplifier 170B (e.g., buffer amplifier) provides a common mode voltage signal to the input signal 112.

In this configuration, the input signal 112 is connected to the positive input 121 of the amplifier 130 via closed switches S1 and S13 and the input signal 113 is connected to the negative input 122 of the amplifier 130 via a resistor R1 and closed switch S6 and S2. The third reference voltage 162C is connected via closed switch S14 to the input to provide the common mode voltage. In addition, the output 123 of the amplifier 130 is connected to the output of the multi-mode configurable amplifier 300B via closed switch S9 and is also fed back via the R2 resistor 212 to the negative input 122 via closed switches S6 and S2. Also by opening switch S5, the second reference voltage 162B (e.g., Vbias_TIA) is disconnected from the positive and negative inputs 121/122 of the amplifier 130. The output 123 of the amplifier is disconnected from the first terminal of the RTIA resistor 210 by opening switches S7 and S8. Also, to prevent leakage of current from the RTIA resistor 210, the switches S10 and S11 are opened and switch S12 connected to the second terminal of the RTIA resistor 210 is closed. The second terminal of the RTIA resistor 210 is connected to ground by closing the switch S12. An output signal (VCM_out) coupled to the input signal 113 is provided via closed switch S15.

Figure 3D:
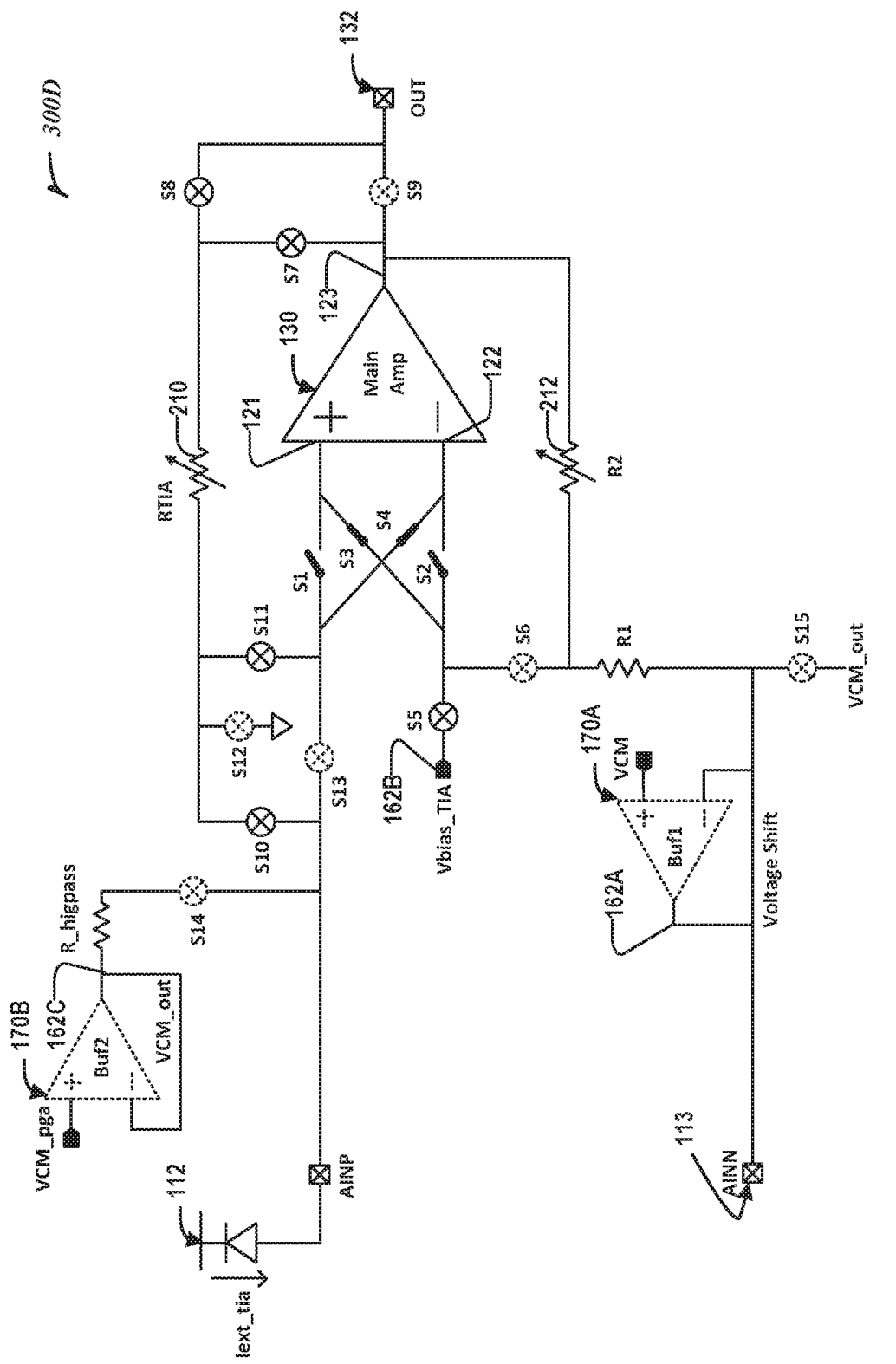

FIG. 3D is a block diagram of an example of a multi-mode configurable amplifier 300D in accordance with various embodiments. Specifically, multi-mode configurable amplifier 300D shows one embodiment of multi-mode configurable amplifier 300A in which the multi-mode configurable amplifier 300A is configured by the control circuitry 140 to operate in a TIA mode. To implement the multi-mode configurable amplifier 300A to operate in the TIA mode, multi-mode configurable amplifier 300D shows which switches of the input routing circuitry 120, leakage prevention routing circuitry 190, and the feedback routing circuitry 150 are controlled to be open or closed by the control signals 142. Elements shown in dashed or dotted lines represent open switches or devices that are disconnected in a particular mode. Such elements and devices are still implemented on the multi-mode configurable amplifier 300D but are in a disconnected state.

For example, to configure the multi-mode configurable amplifier 300D to operate in the TIA mode, a diode (which may be an off-chip component) may be coupled between the input signal 112 and the negative input 122 of amplifier 130. The switches S3, S4, S5, S7, S8, S10 and S11 may be controlled to be in the closed state by the control signals 142 and the switches S1, S2, S6, S9, S12, S13, S14 and S15 may be controlled to be in the open state by the control signals 142. Also, control signals 142 may turn OFF the first and second amplifiers 170A/170B of the reference voltage generation circuitry 170 to avoid generating the first and third reference voltages 162A/162C.

In this configuration, the input signal 112 is connected to the negative input 122 of the amplifier 130 via closed switches S10, S11 and S4. No input signal may be applied to input signal 113 (e.g., input 113 may remain floating). The second reference voltage 162B is connected via closed switch S5 and closed switch S3 to the positive input 121 of the amplifier 130 to provide a bias voltage. In addition, the output 123 of the amplifier 130 is connected to the output of the multi-mode configurable amplifier 300D via closed switches S7 and S8 and is also fed back via the RTIA resistor 210 to the negative input 122 via closed switches S7, S11 and S4. The second terminal of the RTIA resistor 210 is disconnected from ground by opening the switch S12.

Figure 4:
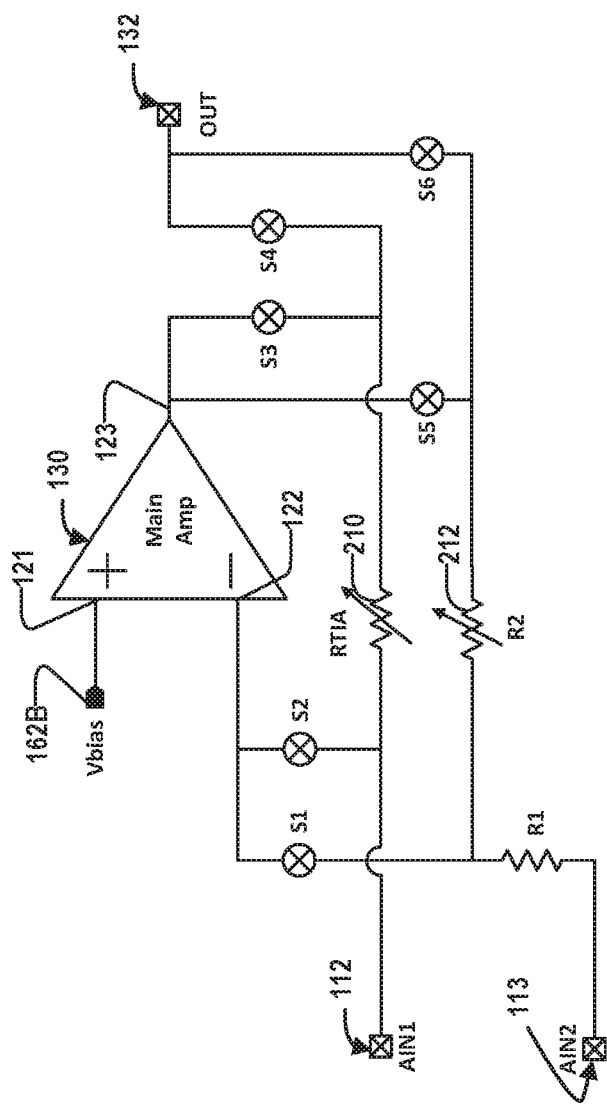
FIG. 4 is a block diagram of an example of a multi-mode configurable amplifier in accordance with various embodiments.

FIG. 4 is a block diagram of an example of a multi-mode configurable amplifier 400 in accordance with various embodiments. Specifically, the amplifier 400 shown in FIG. 4 illustrates one implementation of the multi-mode configurable amplifier 100 (FIG. 1). Multi-mode configurable amplifier 400 includes the RTIA resistor 210 (which may be implemented by a resistor switching network and may be variable), the R2 resistor 212 (which may be implemented by a resistor switching network and may be variable), multiple switches S1-S6, and the second reference voltage 162B. The multi-mode configurable amplifier 400 supports a PGA mode in direct current (DC) and a TIA mode in which one main buffer amplifier 130 is shared to save area and reduce power consumption. For DC PGA mode, the input voltage is received from input signal 113 and for TIA mode, the input current is received from input signal 112.

In one example of the embodiment shown in FIG. 4, switches S1 and S2 and resistor R1 form part of the input routing circuitry 120, a switch coupled between the second reference voltage 162B that is always closed in FIG. 4 forms part of the reference voltage routing circuitry 160, and switches S3-S6, the RTIA resistor 210, and the R2 resistor 212 form part of the feedback routing circuitry 150.

For example, to configure the multi-mode configurable amplifier 400 to operate in the DC PGA mode, the switches S1, S5 and S6 may be controlled to be in the closed state by the control signals 142 and the switches S2, S3 and S4 may be controlled to be in the open state by the control signals 142. In this configuration, the input signal 113 is passed through a resistor R1 to the negative input 122 of the amplifier 130 via switch S1 and is also passed through the resistor R1 to the output 123 of the amplifier 130 via the R2 resistor 212 and switch S5. The output 123 of the amplifier 130 is connected to the output 132 of the multi-mode configurable amplifier 400 via switch S6. The second reference voltage 162B is connected directly to the positive input 121 of the amplifier 130. In addition, the output 123 of the amplifier is fed back via the R2 resistor 212 to the negative input 122 via switches S5 and S1. Input signals 112 and the RTIA resistor 210 are disconnected from the output 123 of the amplifier 130 and the output 132 of the multi-mode configurable amplifier 400 by open switches S3 and S4. The input signals 112 are also disconnected from the negative input 122 of the amplifier 130 by open switch S2.

For example, to configure the multi-mode configurable amplifier 400 to operate in the TIA mode, the switches S1, S5 and S6 may be controlled to be in the open state by the control signals 142 and the switches S2, S3 and S4 may be controlled to be in the closed state by the control signals 142. In this configuration, the input signal 112 is directly connected to the negative input 122 of the amplifier 130 via switch S2 and is also passed through the resistor RTIA 210 to the output 123 of the amplifier 130 via switch S3. The output 123 of the amplifier 130 is connected to the output 132 of the multi-mode configurable amplifier 400 via switch S4. The second reference voltage 162B is connected directly to the positive input 121 of the amplifier 130. In addition, the output 123 of the amplifier is fed back via the RTIA resistor 210 to the negative input 122 via switches S3 and S2. Input signals 113 and the R2 resistor 212 are disconnected from the output 123 of the amplifier 130 and the output 132 of the multi-mode configurable amplifier 400 by open switches S5 and S6. The input signals 112 are also disconnected from the negative input 122 of the amplifier 130 by open switch S1. The second reference voltage 162B can be the same value as the second reference voltage 162B used in the embodiments shown in FIGS. 2A-C and 3A-D or may have a different value specific to the embodiment of FIG. 4.

Figure 5:
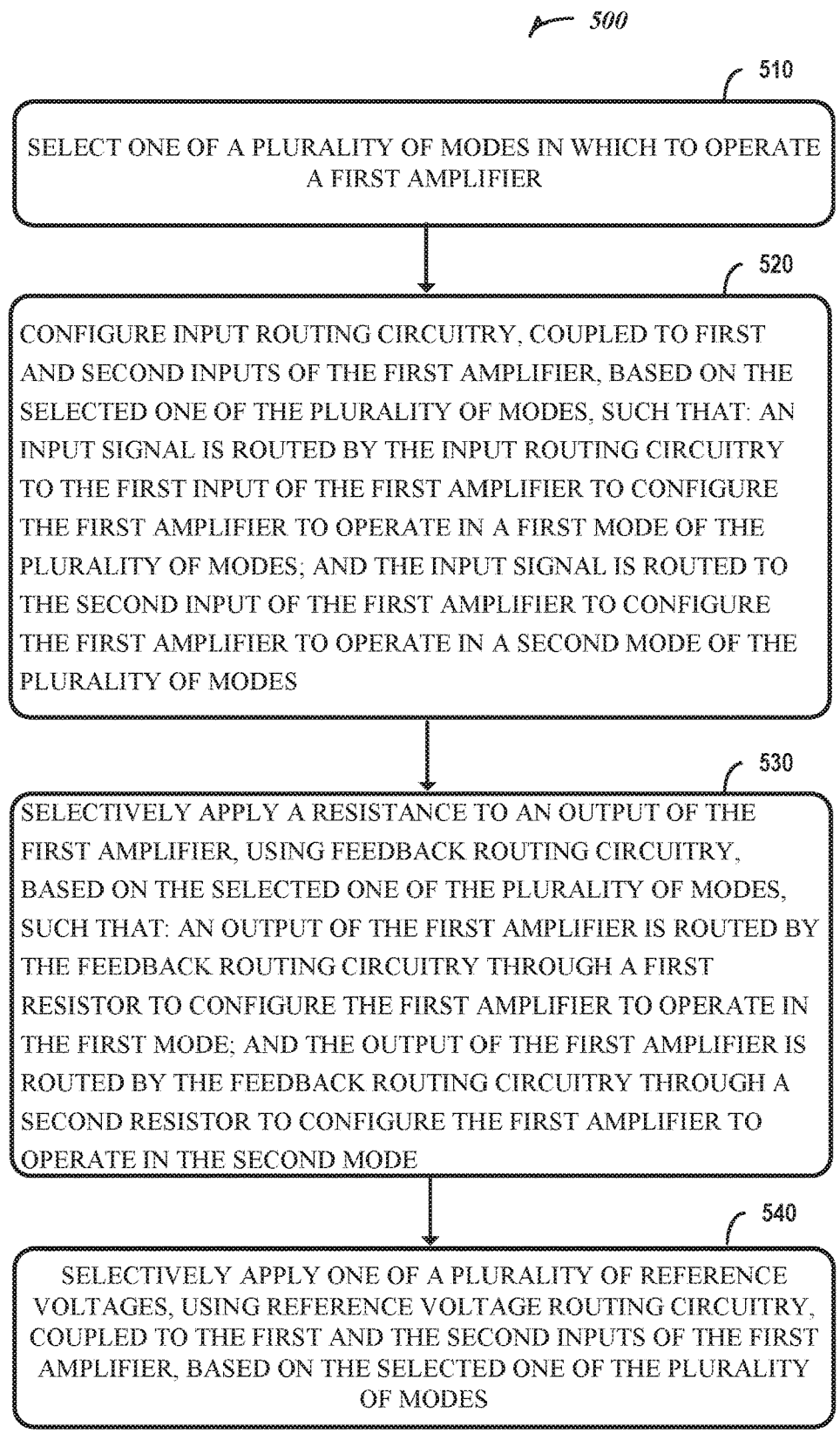
FIG. 5 is a flow diagram depicting an example process for selecting a mode in which to operate a multi-mode configurable amplifier in accordance with various embodiments.

FIG. 5 is a flow diagram depicting an example process 500 for selecting a mode in which to operate a multi-mode configurable amplifier in accordance with various embodiments.

At operation 510, control circuitry 140 selects one of a plurality of modes in which to operate a first amplifier.

At operation 520, control circuitry 140 configures input routing circuitry, coupled to first and second inputs of the first amplifier, based on the selected one of the plurality of modes, such that: an input signal is routed by the input routing circuitry to the first input of the first amplifier to configure the first amplifier to operate in a first mode of the plurality of modes; and the input signal is routed to the second input of the first amplifier to configure the first amplifier to operate in a second mode of the plurality of modes.

At operation 530, control circuitry 140 selectively applies a resistance to an output of the first amplifier, using feedback routing circuitry, based on the selected one of the plurality of modes, such that: an output of the first amplifier is routed by the feedback routing circuitry through a first resistor to configure the first amplifier to operate in the first mode; and the output of the first amplifier is routed by the feedback routing circuitry through a second resistor to configure the first amplifier to operate in the second mode.

At operation 540, control circuitry 140 selectively applies one of a plurality of reference voltages, using reference voltage routing circuitry, coupled to the first and the second inputs of the first amplifier, based on the selected one of the plurality of modes.

Figure 6:
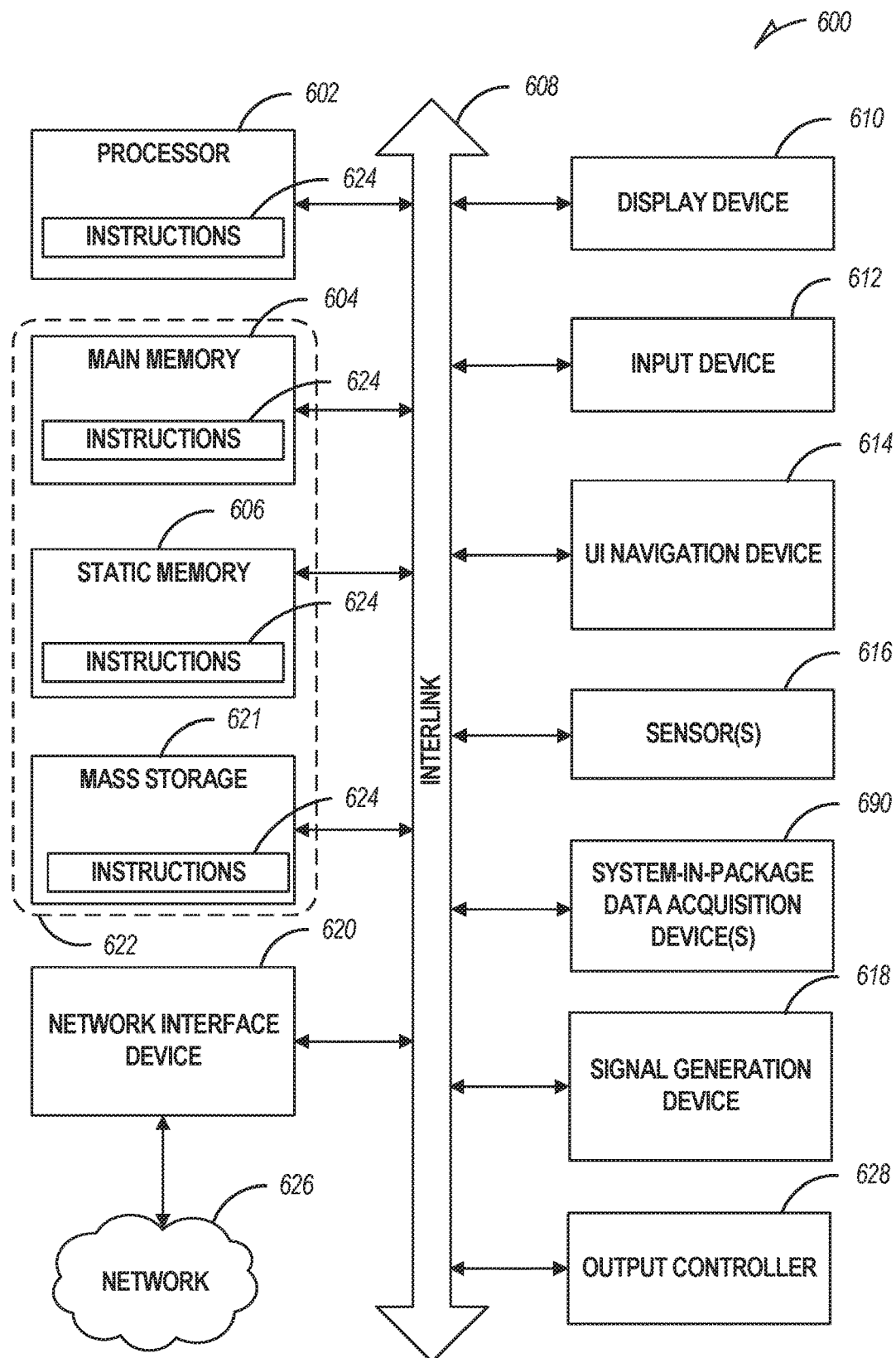
FIG. 6 is a block diagram illustrating an example of a machine upon which one or more embodiments may be implemented.

FIG. 6 is a block diagram of an example machine 600 upon which any one or more of the techniques (e.g., methodologies) discussed herein may be performed. In alternative embodiments, the machine 600 may operate as a stand-alone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. The machine 600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a graphics processing unit (GPU), a hardware processor core, or any combination thereof, such as a memory controller, etc.), a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, alphanumeric input device 612, and UI navigation device 614 may be a touchscreen display. The machine 600 may additionally include a storage device 622 (e.g., drive unit); a signal generation device 618 (e.g., a speaker); a network interface device 620; one or more sensors 616, such as a Global Positioning System (GPS) sensor, wing sensors, mechanical device sensors, temperature sensors, ICP sensors, bridge sensors, audio sensors, industrial sensors, a compass, an accelerometer, or other sensors; and one or more system-in-package data acquisition devices 690. The system-in-package data acquisition device(s) 690 may implement some or all of the functionality of the offset calibration system 100. The machine 600 may include an output controller 628, such as a serial (e.g., universal serial bus (USB)), parallel, or other wired or wireless (e.g., infra-red (IR), near field communication (NFC), etc.) connection to communicate with or control one or more peripheral devices (e.g., a printer, card reader, etc.).

The storage device 622 may include a machine-readable medium on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 621 may constitute the machine-readable medium.

While the machine-readable medium is illustrated as a single medium, the term "machine-readable medium" may include a single medium or multiple media (e.g., a centralized or distributed database, or associated caches and servers) configured to store the one or more instructions 624.

The term "machine-readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data that are stored on the storage device 621 can be accessed by the main memory 604 for use by the hardware processor 602. The main memory 604 (e.g., DRAM) is typically fast, but volatile, and thus a different type of storage from the storage device 621 (e.g., an SSD), which is suitable for long-term storage, including while in an "off" condition. The instructions 624 or data in use by a user or the machine 600 are typically loaded in the main memory 604 for use by the hardware processor 602. When the main memory 604 is full, virtual space from the storage device 621 can be allocated to supplement the main memory 604, however, because the storage device 621 is typically slower than the main memory 604, and write speeds are typically at least twice as slow as read speeds, use of virtual memory can greatly reduce user experience due to storage device latency (in contrast to the main memory 604, e.g., DRAM). Further, use of the storage device 621 for virtual memory can greatly reduce the usable lifespan of the storage device 621.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, peer-to-peer (P2P) networks), among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 600, and includes digital or analog communications signals or other tangible or intangible media to facilitate communication of such software.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim are still deemed to fall within the scope of that claim. Moreover, in the following claims, the terms "first," "second," "third," etc., are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly-language code, a higher-level-language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read-only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above detailed description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the detailed description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A system for switching amplifier modes, the system comprising:
    a first amplifier configured to operate in one of a plurality of modes;
    input routing circuitry, coupled to first and second inputs of the first amplifier, configured to route an input signal to the first input of the first amplifier to configure the first amplifier to operate in a first mode of the plurality of modes and route the input signal to the second input of the first amplifier to configure the first amplifier to operate in a second mode of the plurality of modes;
    feedback routing circuitry, coupled to an output of the first amplifier, configured to route the output of the first amplifier through a first resistor to configure the first amplifier to operate in the first mode and route the output of the first amplifier through a second resistor to configure the first amplifier to operate in the second mode; and
    reference voltage routing circuitry, coupled to the first and the second inputs of the first amplifier, configured to route one of a plurality of reference voltages to the first or second inputs of the first amplifier based on an operation mode of the first amplifier.

2. The system of claim 1 further comprising control circuitry configured to provide a control signal to the input routing circuitry and the feedback routing circuitry, wherein the input routing circuitry comprises:
    a first switch coupled between the input signal and the first input of the first amplifier; and
    a second switch coupled between the input signal and the second input of the amplifier, and
    wherein the control signal configures the first amplifier to operate in the first mode by closing the first switch and opening the second switch and configures the first amplifier to operate in the second mode by opening the first switch and closing the second switch.

3. The system of claim 2, wherein the feedback routing circuitry comprises:
    a third switch coupled between the output of the first amplifier and the first resistor; and
    a fourth switch coupled between the output of the first amplifier and the second resistor, and
    wherein the control signal configures the first amplifier to operate in the first mode by closing the third switch and opening the fourth switch and configures the first amplifier to operate in the second mode by opening the third switch and closing the fourth switch.

4. The system of claim 3, wherein:
    when the third switch is closed, the output of the first amplifier is coupled via the first resistor to the second input of the first amplifier; and
    when the fourth switch is closed, the output of the first amplifier is coupled via the second resistor to the second input of the first amplifier.

5. The system of claim 1, wherein the reference voltage routing circuitry is further configured to:
    route a first reference voltage to the second input of the first amplifier to configure the first amplifier to operate in the first mode;
    route a second reference voltage to the first input of the first amplifier to configure the first amplifier to operate in the second mode; and
    route a third reference voltage to the first input of the first amplifier to configure the first amplifier to operate in a third mode of the plurality of modes, wherein the input routing circuitry is configured to route the input signal to the first input of the first amplifier to configure the first amplifier to operate in the third mode, and wherein the feedback routing circuitry is configured to route the output of the first amplifier through the first resistor to the second input of the first amplifier to configure the first amplifier to operate in the third mode.

6. The system of claim 5, wherein the first mode comprises a programmable gain amplifier direct current mode, the second mode comprises a current to voltage converter mode, and the third mode comprises a programmable gain amplifier alternating current mode.

7. The system of claim 5, wherein the first reference voltage comprises a voltage shift applied to a second input signal that is routed to the second input of the first amplifier when the first amplifier is configured to operate in the first mode, wherein the voltage shift is generated using a first buffer amplifier.

8. The system of claim 1 further comprising leakage prevention routing circuitry, coupled between a terminal of the second resistor and the input signal, configured to:
route the terminal of the second resistor to ground and prevent the terminal of the second resistor from being coupled to the input signal when the first amplifier is configured to operate in the first mode; and
couple the terminal of the second resistor to the input signal when the first amplifier is configured to operate in the second mode.

9. A method for switching amplifier modes, the method comprising:
selecting one of a plurality of modes in which to operate a first amplifier;
configuring input routing circuitry, coupled to first and second inputs of the first amplifier, based on the selected one of the plurality of modes, such that:
an input signal is routed by the input routing circuitry to the first input of the first amplifier to configure the first amplifier to operate in a first mode of the plurality of modes; and
the input signal is routed to the second input of the first amplifier to configure the first amplifier to operate in a second mode of the plurality of modes;
selectively applying a resistance to an output of the first amplifier, using feedback routing circuitry, based on the selected one of the plurality of modes, such that:
an output of the first amplifier is routed by the feedback routing circuitry through a first resistor to configure the first amplifier to operate in the first mode; and
the output of the first amplifier is routed by the feedback routing circuitry through a second resistor to configure the first amplifier to operate in the second mode; and
selectively applying one of a plurality of reference voltages, using reference voltage routing circuitry, coupled to the first and the second inputs of the first amplifier, based on the selected one of the plurality of modes.

10. The method of claim 9 further comprising providing a control signal to the input routing circuitry and the feedback routing circuitry, wherein the input routing circuitry comprises:
a first switch coupled between the input signal and the first input of the first amplifier; and
a second switch coupled between the input signal and the second input of the amplifier, and
wherein the control signal configures the first amplifier to operate in the first mode by closing the first switch and opening the second switch and configures the first amplifier to operate in the second mode by opening the first switch and closing the second switch.

11. The method of claim 10, wherein the feedback routing circuitry comprises:
a third switch coupled between the output of the first amplifier and the first resistor; and
a fourth switch coupled between the output of the first amplifier and the second resistor, and
wherein the control signal configures the first amplifier to operate in the first mode by closing the third switch and opening the fourth switch and configures the first amplifier to operate in the second mode by opening the third switch and closing the fourth switch.

12. The method of claim 11, wherein:
when the third switch is closed, the output of the first amplifier is coupled via the first resistor to the second input of the first amplifier; and
when the fourth switch is closed, the output of the first amplifier is coupled via the second resistor to the second input of the first amplifier.

13. The method of claim 11, wherein the reference voltage routing circuitry is configured to:
route a first reference voltage to the second input of the first amplifier to configure the first amplifier to operate in the first mode;
route a second reference voltage to the first input of the first amplifier to configure the first amplifier to operate in the second mode; and
route a third reference voltage to the first input of the first amplifier to configure the first amplifier to operate in a third mode of the plurality of modes, wherein the input routing circuitry is configured to route the input signal to the first input of the first amplifier to configure the first amplifier to operate in the third mode, and wherein the feedback routing circuitry is configured to route the output of the first amplifier through the first resistor to the second input of the first amplifier to configure the first amplifier to operate in the third mode.

14. The method of claim 13, wherein the first reference voltage comprises a voltage shift applied to a second input signal that is routed to the second input of the first amplifier when the first amplifier is configured to operate in the first mode, and wherein the voltage shift is generated using a first buffer amplifier.

15. The method of claim 11, wherein the first mode comprises a programmable gain amplifier direct current mode, the second mode comprises a current to voltage converter mode, and a third mode comprises a programmable gain amplifier alternating current mode.

16. A system for switching amplifier modes, the system comprising:
an amplifier configured to operate in one of a plurality of modes;
input routing circuitry, coupled to a first input of the amplifier, configured to route a first input signal, received via a first physical connection, to the first input of the amplifier to configure the amplifier to operate in a first mode of the plurality of modes and route a second input signal, received via a second physical connection, to the first input of the amplifier to configure the amplifier to operate in a second mode of the plurality of modes; and
feedback routing circuitry, coupled to an output of the amplifier, configured to route the output of the amplifier through a first resistor to the first input signal to configure the first amplifier to operate in the first mode and route the output of the amplifier through a second resistor to the second input signal to configure the amplifier to operate in the second mode, wherein the first mode comprises a programmable gain amplifier direct current mode, the second mode comprises a current to voltage converter mode, and a third mode comprises a programmable gain amplifier alternating current mode.

17. The system of claim 16, wherein the first and second physical connections comprise respective first and second negative input pins, further comprising control circuitry configured to provide a control signal to the input routing circuitry and the feedback routing circuitry, wherein the input routing circuitry comprises:
    a first switch coupled between the first input signal and the first input of the first amplifier; and
    a second switch coupled between the second input signal and the first input of the amplifier, and
    wherein the control signal configures the first amplifier to operate in the first mode by closing the first switch and opening the second switch and configures the first amplifier to operate in the second mode by opening the first switch and closing the second switch.

18. The system of claim 17, wherein a second input of the amplifier is coupled to a reference voltage.

19. The system of claim 17, wherein the feedback routing circuitry comprises:
    a third switch coupled between the output of the first amplifier and the first resistor; and
    a fourth switch coupled between the output of the first amplifier and the second resistor, and
    wherein the control signal configures the first amplifier to operate in the first mode by closing the third switch and opening the fourth switch and configures the first amplifier to operate in the second mode by opening the third switch and closing the fourth switch.

20. The system of claim 16, further comprising reference voltage routing circuitry, coupled to the first input of the first amplifier, configured to route one of a plurality of reference voltages to the first input of the first amplifier based on an operation mode of the first amplifier.

* * * * *